United States Patent
Wang

(10) Patent No.: US 11,257,643 B2
(45) Date of Patent: Feb. 22, 2022

(54) MAGNETIC ATTRACTIVE ROTARY BUTTON SYSTEM

(71) Applicant: Melexis Technologies SA, Bevaix (CH)

(72) Inventor: Hao Wang, Shanghai (CN)

(73) Assignee: MELEXIS TECHNOLOGIES SA, Bevaix (CH)

( * ) Notice: Subject to any disclaimer, the term of this patent is extended or adjusted under 35 U.S.C. 154(b) by 53 days.

(21) Appl. No.: 16/745,972

(22) Filed: Jan. 17, 2020

(65) Prior Publication Data
US 2020/0243285 A1 Jul. 30, 2020

(30) Foreign Application Priority Data
Jan. 28, 2019 (EP) ..................... 19154032

(51) Int. Cl.
*G01R 33/07* (2006.01)
*H01H 25/06* (2006.01)
*G01D 5/14* (2006.01)
*H01H 36/00* (2006.01)

(52) U.S. Cl.
CPC ............. *H01H 25/06* (2013.01); *G01D 5/145* (2013.01); *G01R 33/077* (2013.01); *H01H 36/002* (2013.01)

(58) Field of Classification Search
CPC ...... G01D 5/145; H01H 36/002; H01H 25/06; G01R 33/077
See application file for complete search history.

(56) References Cited

U.S. PATENT DOCUMENTS

| 5,880,586 | A | 3/1999 | Dukart et al. |
| 8,901,921 | B2 * | 12/2014 | Sterling ................. G01D 5/145 324/207.25 |
| 10,024,690 | B2 | 7/2018 | Eisenbeis |
| 10,240,946 | B2 * | 3/2019 | Sticksel .................. G01B 7/30 |
| 2002/0067159 | A1 * | 6/2002 | Oomkes ................ G01D 5/145 324/207.2 |

(Continued)

FOREIGN PATENT DOCUMENTS

| CN | 105281732 A | 1/2016 |
| DE | 19543564 A1 | 5/1996 |

(Continued)

OTHER PUBLICATIONS

European Search Report in Application No. EP19154032.7, dated Jul. 2, 2019, 6 pages.

*Primary Examiner* — Alesa Allgood
(74) *Attorney, Agent, or Firm* — Workman Nydegger

(57) ABSTRACT

A rotary button system for use in a domestic apparatus, comprising: a ferromagnetic plate; a button removably mountable at a predefined first distance from said ferromagnetic plate on a first side of said plate, and rotatable about a virtual rotation axis substantially perpendicular to said plate, and comprising a permanent magnet magnetised in a direction perpendicular to said rotation axis; and a magnetic sensor device mounted at a predefined second distance from said ferromagnetic plate on a second side of said plate opposite the first side, and comprising one or more magnetic sensors for measuring one or more magnetic field components or field gradients, and configured for determining an angular position of the rotary button based on said one or more field components and/or field gradients.

20 Claims, 7 Drawing Sheets

(56) References Cited

U.S. PATENT DOCUMENTS

| | | | |
|---|---|---|---|
| 2014/0062467 A1 | 3/2014 | Wang et al. | |
| 2016/0334242 A1* | 11/2016 | Ausserlechner | G01R 33/022 |
| 2018/0066963 A1 | 3/2018 | Philipson et al. | |
| 2018/0292233 A1* | 10/2018 | Vandersteegen | G01D 5/145 |
| 2018/0315563 A1* | 11/2018 | Morton | H01F 7/04 |

FOREIGN PATENT DOCUMENTS

| | | |
|---|---|---|
| EP | 1610095 A1 | 12/2005 |
| EP | 3321638 A1 | 5/2018 |
| EP | 3367067 A1 | 8/2018 |
| EP | 3415871 A1 | 12/2018 |
| WO | 2014029885 A1 | 2/2014 |

\* cited by examiner

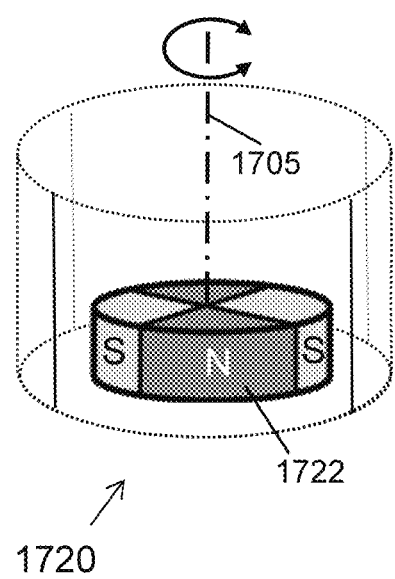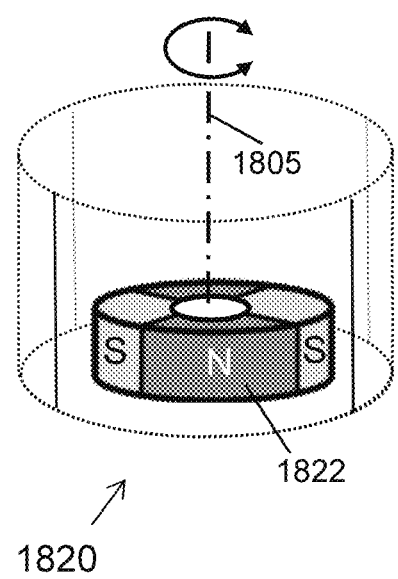
FIG. 17  FIG. 18

MAGNETIC ATTRACTIVE ROTARY BUTTON SYSTEM

FIELD OF THE INVENTION

The present invention relates in general to knobs for domestic appliances, and more in particular to a rotary button system comprising a knob comprising a magnet for use in a domestic appliance (or household device).

BACKGROUND OF THE INVENTION

Domestic appliances such as for example heaters or ovens or microwave ovens often have push-buttons or sliders or rotary buttons for allowing a user to select a particular mode of operation, or for allowing the user to select a particular setting (e.g. a power setting or a temperature setting) of the device. Such buttons are typically subject to mechanical wear, and cleaning of the device may be difficult, especially in the vicinity of the buttons.

CN105281732A describes an inductive switch knob which is easy removable, and an encoding method thereof.

There is always room for improvements or alternatives.

SUMMARY OF THE INVENTION

It is an object of embodiments of the present invention to provide a rotary button system for use in a domestic appliance, wherein the rotary button is easily mountable and easily removable.

It is an object of embodiments of the present invention to provide a rotary button system for use in a domestic appliance, where the rotary button is easier to manufacture.

It is an object of embodiments of the present invention to provide a rotary button system capable of differentiating between one out of three predefined angular positions.

It is an object of embodiments of the present invention to provide a rotary button system capable of measuring an absolute angular position from 0° to 180°.

It is an object of embodiments of the present invention to provide a rotary button system capable of measuring an absolute angular position from 0° to 360°.

It is an object of embodiments of the present invention to provide a rotary button system which has fewer components, and/or is easier to assemble, or which is an alternative to existing solutions.

These and other objects are accomplished by a rotary button system according to embodiments of the present invention.

According to a first aspect, the present invention provides a rotary button system for use in a domestic apparatus, comprising: a ferromagnetic plate; a rotary button removably mountable at a predefined first distance from said ferromagnetic plate on a first side of said plate, and rotatable about a virtual rotation axis substantially perpendicular to said plate, and comprising a permanent magnet magnetised in a direction substantially perpendicular to said rotation axis; a magnetic sensor device mounted at a predefined second distance from said ferromagnetic plate on a second side of said plate opposite the first side; and wherein the magnetic sensor device comprises at least one magnetic sensor for measuring at least one magnetic field component, and is configured for determining an angular position of the rotary button based on said at least one magnetic field component, or wherein the magnetic sensor device comprises at least two magnetic sensors, and is configured for determining at least one magnetic field gradient, and is configured for determining an angular position of the rotary button based on said at least one magnetic field gradient.

Preferably, said magnet is the only magnet of the rotary button system.

This rotary button system can be used, for example, to determine an angular position of a knob of a domestic apparatus, while the knob is easily removable from the apparatus (e.g. without the use of bolts).

It is an advantage that the knob can be held in position in a non-contact manner (more specifically, without the magnet having to directly contact the ferromagnetic plate), and without having to make an opening in the ferromagnetic plate. In this manner, cleaning of the apparatus is made easier, and the risk of contamination of an inner space of the apparatus is reduced.

It is an advantage of this system that the button can be mounted at a predefined distance or position relative to said plate without making direct physical contact with said plate.

It is an advantage of this system that the button can exert an attractive force on the ferromagnetic plate, and vice versa, for holding the button (with the magnet) in position.

It is an advantage of this system that no second magnet is required for holding the button in position, e.g. located on the same side as the magnetic sensor device.

There is a common believe that a static magnetic field cannot pass beyond a ferromagnetic plate (because the ferromagnetic plate functions as a shield), or it is at least contra-intuitive.

It is noted that a magnetic sensor device with a single magnetic sensor is not ideal, but it is sufficient to determine (or at least approximate) an angle in an 180° angular range (e.g. using a look-up table), which may be sufficient for certain domestic applications.

In an embodiment, the magnetic sensor device comprises only a single magnetic sensor, and is configured for determining one out of three predefined angular positions.

This can be implemented for example by measuring the magnetic field component (e.g. By), and if the measured field component has a value higher than a first predefined threshold value to decide that the knob is in a first position, and if the measured field component has a value smaller than a second predefined threshold value to decide that the knob is in a second position, and if the measured field component has a value between the first and second predefined threshold value, to decide that the knob is in a third position. The first predefined threshold value may be a positive value, and the second predefined threshold value may be a negative value.

In an embodiment, the magnetic sensor device comprises at least two magnetic sensors for measuring at least two magnetic field components preferably in different directions, and is configured for determining an angular position of the rotary button based on said at least two magnetic field components.

It is an advantage of this rotary button system that it allows to more accurately determine said angular position, and in a range of 360°. The at least two magnetic sensors preferably have an axis of maximum sensitivity forming an angle of about 90°.

In an embodiment, the magnetic sensor device comprises at least four magnetic sensors for measuring at least four magnetic field components, and is configured for determining at least two magnetic field gradients in different directions, and is configured for determining an angular position of the rotary button based on said at least two magnetic field gradients.

The four magnetic sensors are preferably organized in two pairs of sensors, the sensors of each pair being arranged in a same direction, but being spaced apart in said direction, the sensors of different pairs being oriented in different directions.

In an embodiment, the ferromagnetic plate has a substantially disk shape.

It is an advantage if the metal plate has a disk shape or a circular cross section, because such a shape does not favour certain angular positions above others. In other words, a circular shape is ideal for detecting any arbitrary position of the knob. (It is noted that a disk shape does not have a central opening, in contrast to a ring shape).

In an embodiment, the diameter of the disk shape is larger than 3 mm, or larger than 4 mm, or larger than 5 mm, or larger than 6 mm, or larger than 7 mm, or larger than 8 mm, or larger than 10 mm, or larger than 12 mm, or larger than 14 mm, or larger than 16 mm, or larger than 18 mm, or larger than 20 mm, or larger than 25 mm, or larger than 30 mm, or larger than 35 mm, or larger than 4 cm, or larger than 5 cm, or larger than 6 cm, or larger than 7 cm, or larger than 8 cm, or larger than 9 cm, or larger than 10 cm.

In an embodiment, the diameter of the disk shape is a value in the range from 3 mm to 20 mm, or in the range from 5 mm to 15 mm, or from 5 mm to 10 mm.

In an embodiment, the diameter of the disk shape is larger than 60% of a transverse dimension of the magnet, or at least 70%, or at least 80%, or at least 90%, or at least 100% or at least 110%, or at least 120%, or at least 130%, or at least 140%, or at least 150%, or at least 175%, or at least 200%, or at least 300%, or at least 400%, or at least 500%.

In an embodiment, the ferromagnetic plate has a substantially rectangular shape.

In an embodiment, the rectangle has an area chosen such that a perpendicular projection of the magnet on the plane of the metal plate overlaps at least for 60% with the metal plate, or at least 70%, or at least 80%, or at least 90%, or at least 100%, or at least 110%, or at least 120%, or at least 130%, or at least 140%, or at least 150%, or at least 175%, or at least 200%, or at least 300%, or at least 400%, or at least 500%.

In an embodiment, the ferromagnetic plate has a shape and size sufficiently large, such that the ferromagnetic plate prevents that the magnetic sensor device and the magnet are in direct line of sight, for any angular position of the knob, when the knob is mounted to the ferromagnetic plate.

In an embodiment, the ferromagnetic plate has a thickness in the range from 0.3 to 1.0 mm, for example equal to about 0.5 mm, or equal to about 0.6 mm, or equal to about 0.7 mm, or equal to about 0.8 mm, or equal to about 0.9 mm.

In an embodiment, the magnetic sensor device is located substantially on said rotation axis.

It is an advantage if the sensor devices located at a very small (ideally zero) offset from said rotation axis, because this allows a more accurate angular position. Such position is typically referred to as an "on-axis" position.

Preferably the offset (in radial direction) between the magnetic sensor device and the rotation axis is smaller than 3 mm, or smaller than 2 mm, or smaller than 1.0 mm.

In an embodiment, the magnetic position sensor comprises a semiconductor substrate; and has a plurality of magnetic sensors configured for measuring at least two magnetic field components oriented parallel to the semiconductor substrate (also referred to herein as "in-plane field components"), preferably in different directions, and for determining said angular position based on these at least two magnetic field components.

Preferably the two in plane magnetic field components are oriented substantially perpendicular to each other. This allows to calculate the angular position of the magnet for example based on an arctan or arctan 2 function.

In an embodiment, the plurality of magnetic sensors comprises at least a first vertical Hall element having a first axis of maximum sensitivity in a first direction parallel to the semiconductor substrate, and a second vertical Hall element having a second axis of maximum sensitivity in a second direction parallel to the semiconductor substrate, different from the first direction.

Preferably, the first and the second direction form an angle equal to about 90°, but that is not absolutely required for the invention to work, and any angle in the range from 20° to 160° would also work.

In an embodiment, the plurality of magnetic sensors comprises at least four horizontal Hall elements and at least one integrated magnetic concentrator.

In case only a single integrated magnetic concentrator (IMC) is present, this IMC may have a circular shape or a "plus sign" shape or any other suitable shape. But it is also possible to provide a first pair of horizontal Hall elements with a first elongated IMC oriented in the X direction, and a second pair of horizontal Hall elements with a second elongated IMC oriented in the Y direction, preferably perpendicular to the X direction.

In an embodiment, the permanent magnet is a diametrically magnetized disk magnet arranged substantially coaxially with said rotation axis.

In an embodiment, the permanent magnet is a diametrically magnetized ring magnet arranged substantially coaxially with said rotation axis.

In an embodiment, the permanent magnet is an axially magnetised magnet arranged such that the axial direction of the magnet is substantially perpendicular to said rotation axis.

In an embodiment, the permanent magnet is a multipole disk magnet or a multipole ring magnet, magnetized in a plane substantially perpendicular to said rotation axis, for example a four-pole disk or ring magnet. The multi-pole magnet preferably has at least four or at least six poles.

This is illustrated for example in FIG. 1 and FIG. 12 to FIG. 14, but the present invention is not limited to these examples.

In an embodiment, the magnet is a diametrically magnetised disk magnet having a diameter (Dm) in the range from 4 to 14 mm, or from 4 to 10 mm.

In an embodiment, the magnet is a multipole disk or ring magnet having a diameter in the range from 4 to 14 mm, or from 4 to 10 mm.

In an embodiment, the magnet is an axially magnetised magnet having an axial length (Lm) in the range from 4 to 14 mm, or from 4 to 10 mm.

In an embodiment, the second distance between the magnetic sensor device and the ferromagnetic plate is a value in the range from 0.5 to 6.5 mm, or in the range from 1.0 to 4.5 mm, or from 1.25 to 4.0 mm, for example equal to about 1.5 mm, or equal to about 2.0 mm, or equal to about 2.5 mm, or equal to about 3.0 mm, or equal to about 3.5 mm, or equal to about 4.0 mm.

This distance can for example be created by mounting the magnet inside the knob at a non-zero offset from a bottom plane, or can for example be created by providing a glass or plastic sheet between the metal plate and the knob, or in any other suitable way.

In an embodiment, the magnet is a diametrically magnetised disk magnet having a diameter in the range from 4 to 14 mm or an axially magnetised magnet having an axial length in the range from 4 to 14 mm; and the first distance between the ferromagnetic plate and the magnet is a value in the range from 0.5 to 1.5 mm; and the ferromagnetic plate has a thickness in the range from 0.3 to 1.0 mm; and the second distance between the ferromagnetic plate and the magnetic sensor device is a value in the range from 1.0 to 4.5 mm, and preferably the ferromagnetic plate has an area in the range from 15 mm$^2$ to about 400 cm$^2$.

In an embodiment, the magnetic sensor device is further adapted for determining a presence of the rotary button at said predefined distance from the ferromagnetic plate.

In an embodiment, the magnetic sensor device is further adapted for determining a presence of the rotary button at said predefined distance from the ferromagnetic plate by measuring at least two magnetic field components, and by determining whether at least one of these measured field components has a value larger than a predefined threshold.

Particular and preferred aspects of the invention are set out in the accompanying independent and dependent claims. Features from the dependent claims may be combined with features of the independent claims and with features of other dependent claims as appropriate and not merely as explicitly set out in the claims. These and other aspects of the invention will be apparent from and elucidated with reference to the embodiment(s) described hereinafter.

BRIEF DESCRIPTION OF THE DRAWINGS

FIG. 3 also shows presumed exemplary magnetic field lines.

FIG. 17 shows another variant of the button shown in FIG. 1 or FIG. 2, comprising a multipole disk magnet magnetized in a direction substantially perpendicular to the rotation axis of the knob.

FIG. 18 shows a variant of FIG. 17, wherein the knob 1820 comprises a four-pole ring magnet. The drawings are only schematic and are non-limiting. In the drawings, the size of some of the elements may be exaggerated and not drawn on scale for illustrative purposes. Any reference signs in the claims shall not be construed as limiting the scope. In the different drawings, the same reference signs refer to the same or analogous elements.

DETAILED DESCRIPTION OF ILLUSTRATIVE EMBODIMENTS

Figure 1:
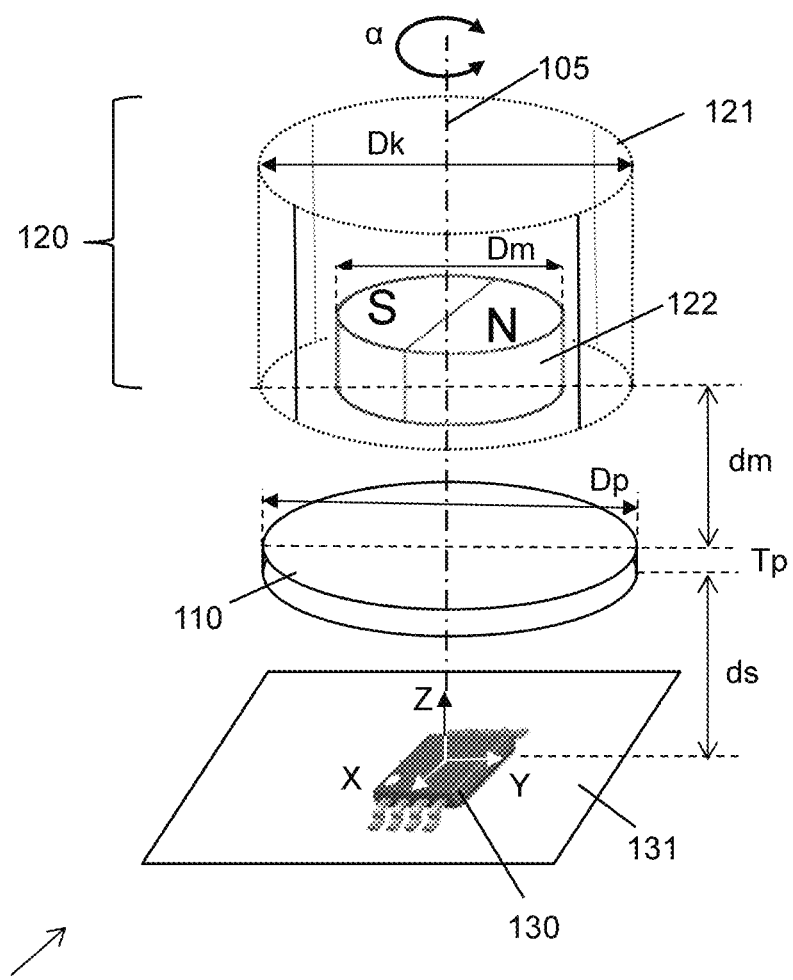
FIG. 1 shows an exemplary rotary button system according to an embodiment of the present invention in perspective view.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, under and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly, it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

In this document, the term "metal plate" or "metal sheet" are used as synonyms. In the context of the present invention, the metal plate is a "ferromagnetic plate".

In this document, the term "magnet" or "permanent magnet" mean the same.

Figure 12:
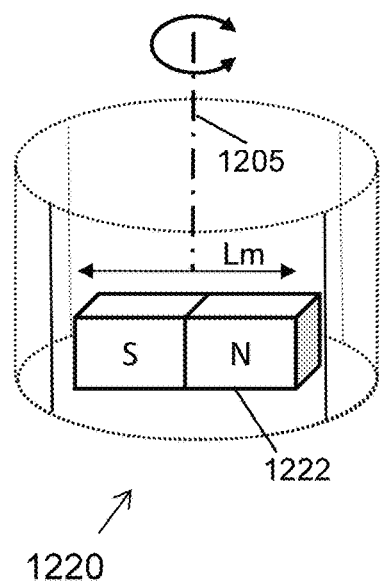
FIG. 12 shows a variant of the button shown in FIG. 1 or FIG. 2, comprising an axially magnetized bar magnet oriented perpendicular to the rotation axis of the knob.
Figure 13:
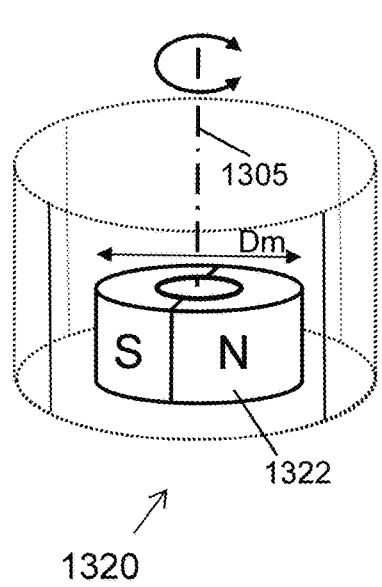
FIG. 13 shows another variant of the button shown in FIG. 1 or FIG. 2, comprising a diametrically magnetized ring magnet, having a central axis coinciding with the rotation axis of the knob.
Figure 14:
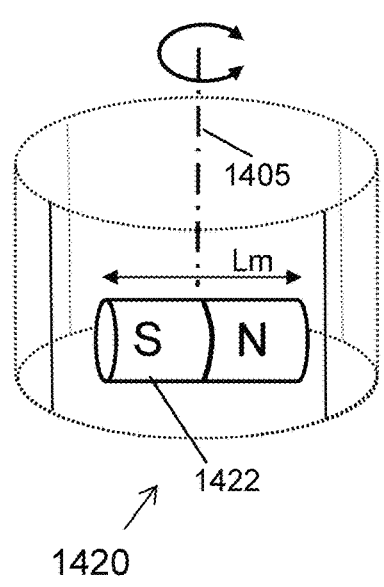
FIG. 14 shows another variant of the button shown in FIG. 1 or FIG. 2, comprising an axially magnetized cylindrical magnet oriented perpendicular to the rotation axis of the knob.

When reference is made to "transverse dimension" of the magnet, what is meant is a "diameter" of a disk shaped or ring shaped magnet, or an "axial length" of an axially magnetized magnet, as illustrated for example in FIG. 12 to FIG. 14.

The term "magnetic sensor" as used herein may refer to one or more sensor elements capable of measuring one or more magnetic effects, such as the Hall effect, or magnetoresistive (MR) effects. Non-limiting examples for magnetoresistive effects include GMR (giant magnetoresistance), CMR (colossal magnetoresistance), AMR (anisotropic magnetoresistance) or TMR (tunnelling magneto-resistance). Depending on the context, the term "magnetic sensor" may refer to a single magnetic sensitive element (e.g. a Horizontal Hall element or a Vertical Hall element), or to a group of magnetic elements (e.g. arranged in a Wheatstone bridge, or to a group of at least two Hall sensor elements connected in parallel), or to a sub-circuit further comprising one or more of: a biasing circuit, a readout circuit, an amplifier, an Analog-to-Digital converter, etc.

The present invention relates to knobs for domestic appliances, more in particular for kitchen appliances, for example to a knob for an oven, or a knob for a microwave oven, or the like, and to a subsystem capable of determining an angular position of such a knob. The knob of the present invention does not contain a sliding metal contact (in contrast to for example potentiometers).

Figure 3:
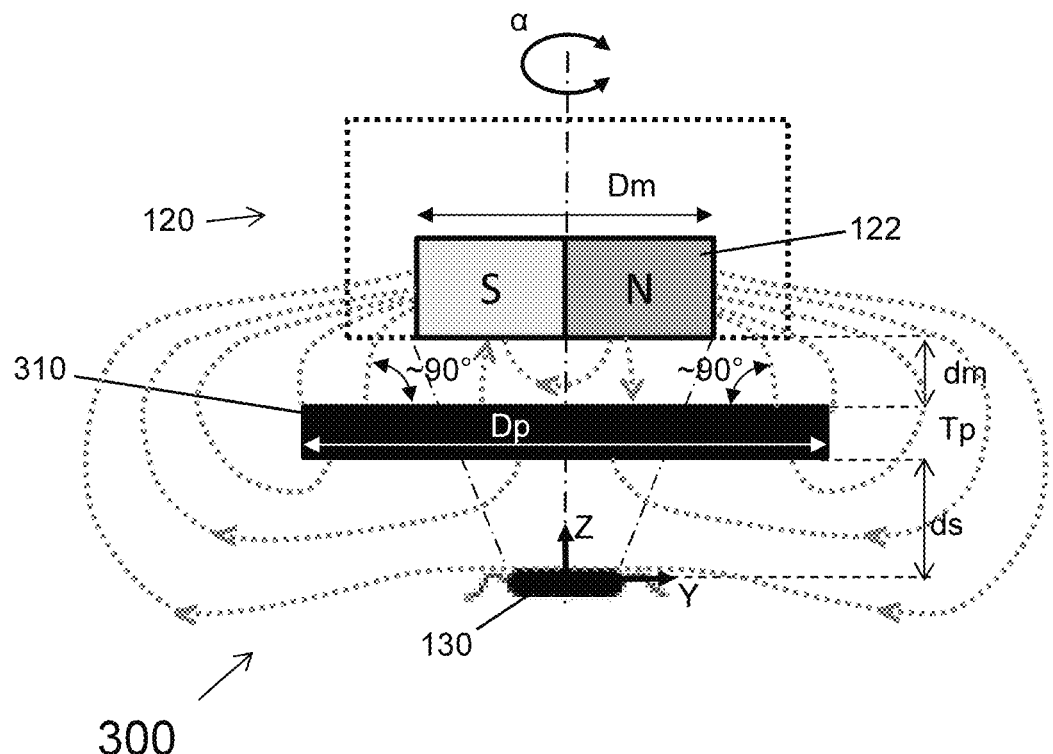
FIG. 3 shows a variant of the rotary button system of FIG. 1 in side view. It illustrates the relative positions of the knob, the magnet inside the knob, the metallic plate, and the sensor device.

The present invention provides a rotary button system for use in a domestic apparatus, e.g. a kitchen appliance. The rotary button system comprises: a ferromagnetic plate or a ferromagnetic sheet, a button, and a magnetic sensor device. The button is removably mountable at a predefined first distance from said ferromagnetic plate on a first side of said plate (e.g. at a front side of a front panel of the kitchen appliance). The button is rotatable about a virtual rotation axis substantially perpendicular to said plate. The button comprises a permanent magnet (typically encapsulated in the button). The magnet is magnetised in a direction substantially perpendicular to said axis, or stated in other words, when the button is mounted to said plate, the magnet is magnetised in a direction substantially parallel to the ferromagnetic plate. The resulting magnetic field may have a topology as illustrated in FIG. 3, but the present invention is not limited to this particular example. The magnetic sensor device is mounted at a predefined second distance from said ferromagnetic plate, on a second side of said plate opposite the first side (e.g. on the back side of said front panel). The magnetic sensor device may comprise at least one magnetic sensor for measuring at least one magnetic field component, preferably an in-plane field component (e.g. a field component Bx or By parallel to the semiconductor plane), and may be configured for determining an angular position of the rotary button based on said at least one field component. The magnetic sensor device may comprise at least two magnetic sensors for determining at least one magnetic field gradient (e.g. dBx/dx or dBy/dy), and may be configured for determining an angular position of the rotary button based on said at least one magnetic field gradient.

This combination of features provides the effect that the permanent magnet and the ferromagnetic plate attract each other without the need for an additional magnet, in contrast to the system described in CN105281732A, where two axially magnetized magnets are arranged on opposite sides of a glass plate such that the axial direction is perpendicular to the glass plate.

But besides the attractive force between the magnet and the ferromagnetic plate, the magnetic field created by the permanent magnet can surprisingly also be sensed by the magnetic sensor, even though the sensor is located on the opposite side of the ferromagnetic plate, or "behind" the ferromagnetic plate. This is far from trivial, because there is a common believe that ferromagnetic material shields or blocks a magnetic field. In addition, it is also counter-intuitive to orient a magnet such that the magnetisation is parallel to the plate, because intuitively one would expect that such field lines will not penetrate through the metal plate, and thus cannot be sensed on the other side of the metal plate. Intuitively one would expect that the magnetic flux is attracted by the ferromagnetic plate acting like a shield, and one would expect therefore that the magnetic field is substantially zero "behind" the ferromagnetic plate.

Yet, the inventors surprisingly found that it is very well possible to measure a magnetic field at this location.

Or stated in other words, the inventors surprisingly found (1) that it is possible to hold the knob with the magnet in place by means of a ferromagnetic plate without needing a second magnet, (2) that the magnet is attracted by the metal plate, even if the magnet is magnetized in a direction parallel to the metallic plate, and (3) that it is possible to measure a magnetic field corresponding to the angular position of the magnet, even if the magnet is magnetised in a direction parallel to the plate, and even if the magnetic sensor is located "behind" the ferromagnetic plate.

The present invention is at least partially based on these insights, which are not known in combination in the prior art.

Referring now to the figures.

FIG. 1 shows an exemplary rotary button system 100 in perspective view. This rotary button system 100 may be part of a domestic apparatus. The button system comprises a ferromagnetic plate 110, and a button 120 removably mountable from said plate. The button 120 is rotatable about a virtual rotation axis 105 substantially perpendicular to said plate 110. The button comprises a permanent magnet 122 magnetised in a direction perpendicular to said rotation axis 105. In the example of FIG. 1, the permanent magnet 122 is a diametrically magnetized disk magnet, but other magnets may also be used (see e.g. FIG. 12 to FIG. 14). The magnet 122 is located at a predefined first distance "dm" from said ferromagnetic plate 110 on a first side of said plate (in the example on the top side).

The rotary button system 100 further comprises a magnetic sensor device 130 mounted at a predefined second distance "ds" from said ferromagnetic plate 110 on a second side of said plate opposite the first side, in the example of FIG. 1 at the bottom side of the plate.

The magnetic sensor device 130 comprises at least one magnetic sensor (e.g. a single vertical Hall element), and is configured for determining an absolute angular position α of the rotary button 120 based on said measured field component, or for determining a most likely angular position selected from a limited set of predefined angular positions. The limited set may consist of only two or only three or only four or only five predefined angular positions.

Alternatively, the magnetic sensor device 130 may comprise a plurality of magnetic sensors (e.g. at least four Horizontal Hall elements, or at least two Vertical Hall elements) for measuring at least two magnetic field components (for example two in-plane magnetic field components Bx, By). This magnetic sensor device 130 may be configured for determining an absolute angular position α of the rotary button 120 based on said at least two measured field components. This embodiment offers the advantage that the angular position can be determine more accurately, over a larger range (e.g. 360°), and that it is more robust to ageing or demagnetisation of the magnet.

In the example of FIG. 1, the magnet 122 and the magnetic sensor device 130 cannot "see" each other directly (no direct "line of sight"), because the ferromagnetic plate 110 is located between the magnetic position sensor 130 and the button 120. As illustrated in FIG. 3, this does not necessarily mean that the metal plate size needs to be larger than a perpendicular projection of the magnet, but it may be slightly smaller (as indicated by the conical shape), depending on the distances "dm" and "ds".

In some embodiments, the size of the metal plate is at least larger than the perpendicular projection of the magnet. This has a positive influence on the attractive force.

In the example of FIG. 1, the knob 121 has a cylindrical shape with an outer diameter "Dk" substantially equal to the diameter Dp of the metal plate 110, but that is not required for the present invention to work. In fact, the dimensions of the knob have no significant influence on the working of the system, except for the weight of the knob. The attractive force needs to be sufficiently large to hold the knob. For a given knob, the skilled person can easily find a suitable magnet (e.g. by trial and error).

The diameter Dm of the disk magnet 122 is preferably smaller than or equal to the diameter Dp of the ferromagnetic plate. This has the advantage that the entire bottom side of the magnet 122 is facing a portion of the ferromagnetic plate.

The magnetic sensor device 130 is preferably a packaged semiconductor device. In the example of FIG. 1, the package has 8 pins, but of course, another package could also be used. The magnetic sensor device may be soldered on a printed circuit board 131 (PCB). The PCB may contain also other components (not shown).

In some embodiments, the knob can be rotated over 360°. While not shown, the knob may have a position indicator, and the domestic appliance may have indications corresponding to particular modes or settings (e.g. operation modes of a microwave oven, and/or temperature settings, or the like).

Figure 2:
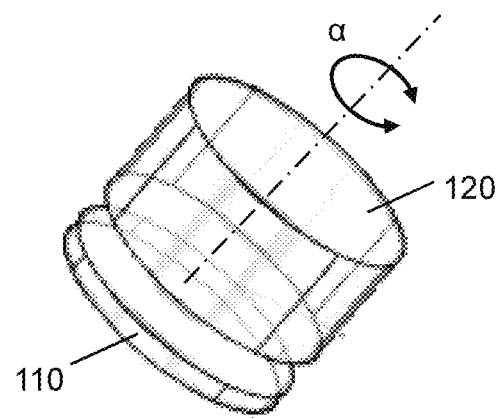
FIG. 2 shows the knob and the metal plate or metal sheet of the system of FIG. 1. The metal plate may be part of a front panel of a domestic appliance. The knob is completely removable.

FIG. 2 shows the knob 120 and the metal plate 110 or metal sheet of the system of FIG. 1. At least the knob is visible to the user. The metal plate may be visible, or may be hidden behind another plate, e.g. a glass plate or a plastic plate, or a plate made of another suitable material. As can be seen, the button is not mounted on a physical axis which extends from the metal plate, but is held in place by the mutual attraction force between the magnet (inside the button) and the metal plate. The user can easily mount the button by bringing the button in the vicinity of the plate, and can easily remove the button by exerting a force larger than the attractive force. Such a mounting does not suffer from mechanical wear due to a metal to metal contact, and allows easy cleaning. In addition, since no opening needs to be made in the front panel and/or in the metal plate, contamination can be avoided.

FIG. 3 shows a rotary button system 300 in side view, which is a slight variant of the rotary button system 100 of FIG. 1. The main difference is that the metal plate 310 of FIG. 3 has a slightly larger diameter Dp than the metal plate 110 of FIG. 1. The plate thickness Tp is exaggerated for illustrative purposes (to show magnetic flux lines). In reality the plate thickness is typically only about 0.3 to 1.0 mm, or only 0.3 to 0.8 mm, or only 0.4 to 0.6 mm, e.g. equal to about 0.5 mm.

FIG. 3 illustrates the relative position of the knob 120, the magnet 122 inside the knob, the metal plate 310, and the sensor device 130.

While the inventors do not wish to be bound by any theory, FIG. 3 also shows exemplary magnetic field lines which may be present in this rotary button system, and which may help to better understand the underlying principles of the present invention.

In close vicinity of the metal plate 310, the magnetic field lines are substantially perpendicular to the metal plate. The magnitude of the attractive force between the magnet 122 and the metal plate 310 is mainly dependent on the distance "dm" of the gap between the magnet and the metal plate. As already indicated above, this gap may be partially or completely filled with air, or with glass or a plastic material, e.g. a non-magnetic material.

As for the magnetic field on the other side of the ferromagnetic plate, actually two phenomena may be observed: (i) for relatively small ferromagnetic plates, the plate seems to act as a concentrator, it draws the magnetic flux in its direction, and almost no magnetic field lines are closing above the magnet. However, as the plate is relatively thin, it saturates at some points and the magnetic field lines go around the plate and close also below the plate at the IC location, where the magnetic field can be measured; (ii) for relatively large ferromagnetic plates (not shown in FIG. 3), the ferromagnetic plate can be magnetised, and can carry a magnetization that is sensed by the magnetic sensor device 130.

In both cases, the angular position of the knob is directly related to the orientation of the magnetic field lines, thus by measuring the magnetic field, the angular position of the knob can be determined. For completeness, it is pointed out that, for a given magnet, the skilled person can easily find suitable ferromagnetic plate dimensions, for example by trial and error.

Figure 4:
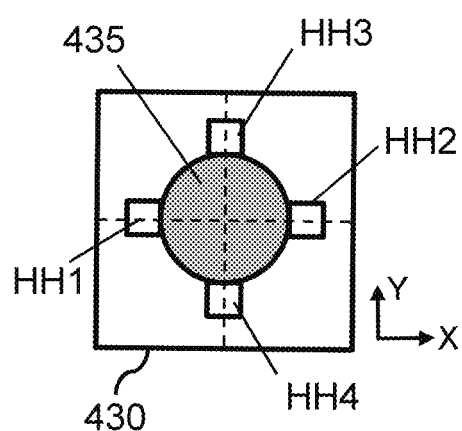
FIG. 4 shows an exemplary block diagram of an angular position sensor device comprising four Horizontal Hall elements and a disk shaped IMC, as may be used in the rotary button system of FIG. 1 or FIG. 2.

FIG. 4 shows an exemplary block diagram of an angular position sensor device 430 comprising four Horizontal Hall elements HH1-HH4 and a disk shaped integrated magnetic concentrator 435 (abbreviated as IMC), as may be used in the rotary button system of FIG. 1 and FIG. 2. This magnetic sensor device 430 is adapted for measuring two in-plane magnetic field components Bx and By. This sensor device comprises two pairs of horizontal Hall elements and a disk-shaped IMC. These sensor elements may be readout by the processing circuit shown in FIG. 11, which may be comprised in the magnetic sensor device 430.

In a variant of FIG. 4, the angular position sensor device 430 comprises only two horizontal Hall elements, for example only HH1 and HH2, or only HH3 and HH4, and the IMC may have a rectangular shape. This allows to measure only one magnetic field component, e.g. By or Bx but not both. But a single magnetic sensor may be sufficient for some applications, because it allows to measure an angular position in a 180° range (e.g. by comparing the measured value with a predefined table of values, each corresponding to a predefined angular position).

Other variants are also possible.

Figure 5:
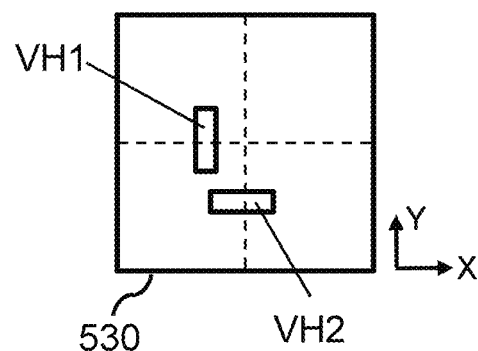
FIG. 5 shows an exemplary block diagram of an angular position sensor device comprising two vertical Hall elements, as may be used in the rotary button system of FIG. 1 or FIG. 2.

FIG. 5 shows an exemplary block diagram of another angular position sensor device 530 comprising two vertical Hall elements VH1, VH2, as may be used in the rotary button system of FIG. 1 and FIG. 3. This magnetic sensor device 530 is adapted for measuring two in-plane magnetic field components Bx and By. These sensor elements may be readout by the processing circuit shown in FIG. 10, which may be comprised in the magnetic sensor device 530.

It is noted however that the present invention is not limited to sensor devices comprising horizontal Hall elements or vertical Hall elements, and other magnetic sensor elements may also be used, for example based on a magnetoresisitve sensor (e.g. a Wheatstone bridge of anisotropic magnetoresistive (AMR) or giant magnetoresistive (GMR) or tunneling magnetoresistive (TMR) sensors.

In a variant of FIG. 5, the angular position sensor device only comprises a single magnetic sensor, for example only the vertical Hall element VH1, or only the vertical Hall element VH2.

Figure 6:
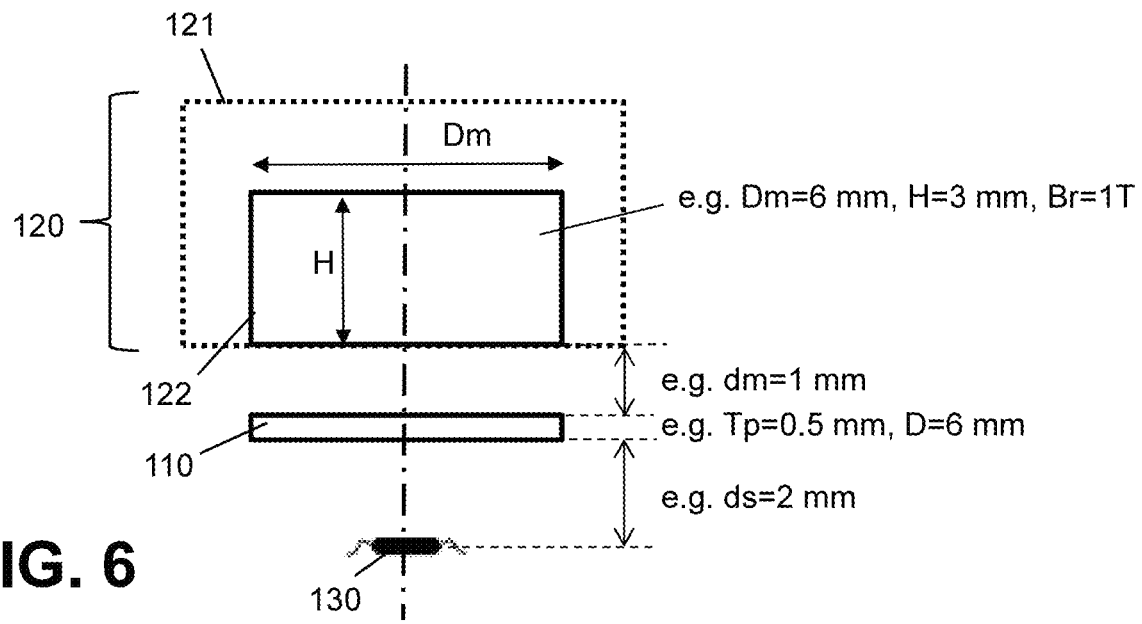
FIG. 6 shows the arrangement of FIG. 3 with specific dimensions. This arrangement was simulated, and the results are shown in FIG. 7 to FIG. 9.
Figure 7:
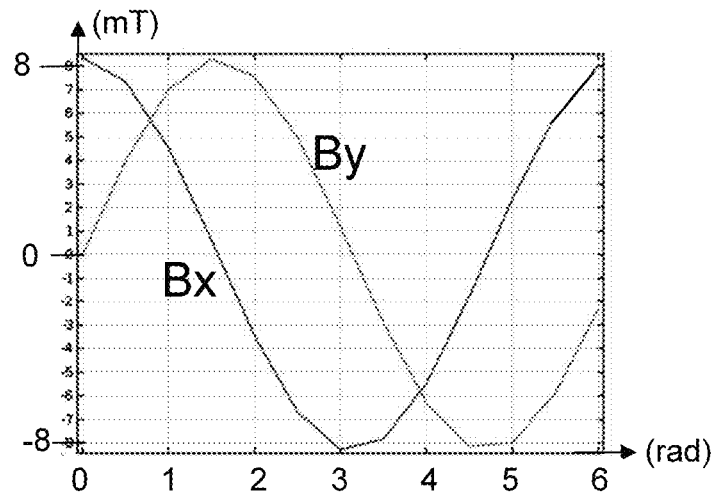
FIG. 7 shows exemplary waveforms of "in-plane" magnetic field components Bx, By as can be measured by the sensor device of the system shown in FIG. 6, as a function of the rotation angle of the knob.
Figure 8:
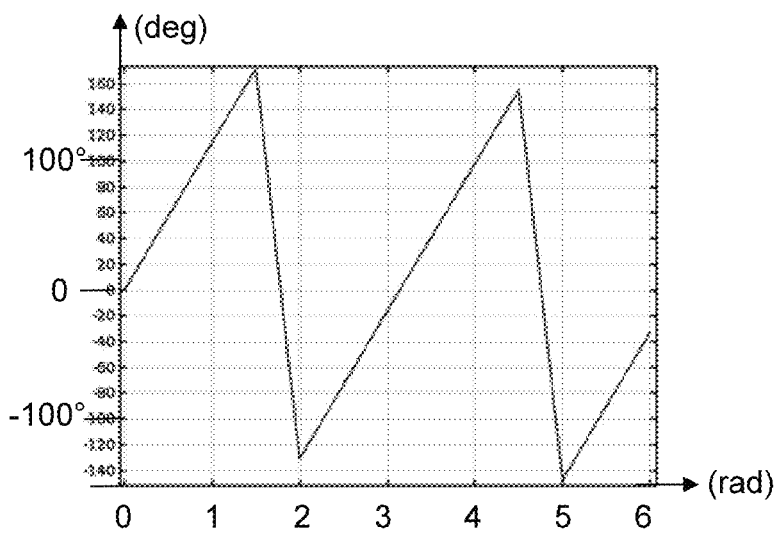
FIG. 8 shows how the signals of FIG. 7 can be used to calculate an angle, for example using an arctan or arctan 2 function.
Figure 9:
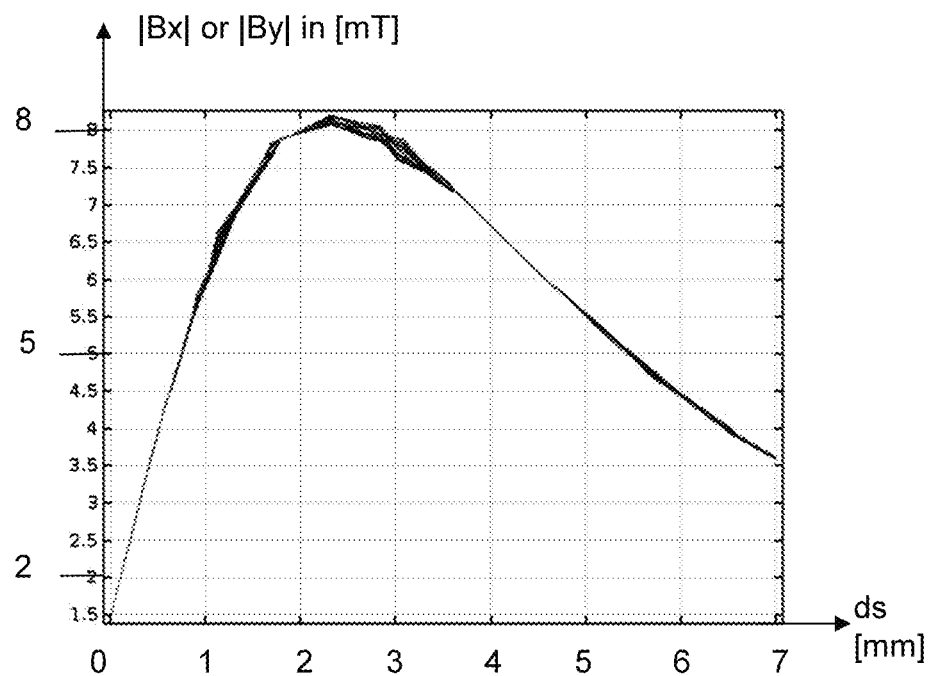
FIG. 9 shows how the signal strength of the signals of FIG. 7 varies as a function of the distance between the metal plate and the sensor device.

FIG. 6 shows the arrangement of FIG. 3 with specific dimensions. This arrangement was simulated, and the results are shown in FIG. 7 to FIG. 9. In this example, the magnet 122 is a diametrically magnetized disk magnet having a diameter Dm=6 mm, and a height H=3 mm, and a remanent magnetic field Br=1T. The distance between the magnet 122 and the metal plate is 1.0 mm. (in the simulation this distance is an airgap, but in practice, this space may be fully or partially filled for example with non-magnetic material, e.g. glass or a plastic material). The ferromagnetic plate may be Stainless steel, for example stainless steel 405. The diameter Dm of the metal plate may be 6.0 mm, and the thickness Tp equals 0.5 mm. The distance ds between the sensor device 130 and the metal plate is 2.0 mm in this example (but as will be illustrated in FIG. 9, this distance is not critical for the invention to work).

FIG. 7 to FIG. 9 show simulation results for the exemplary embodiment depicted in FIG. 6.

FIG. 7 shows exemplary waveforms of "in-plane" magnetic field components Bx, By as can be measured by the sensor device of the system shown in FIG. 6, as a function of the rotation angle α of the knob 120. As can be seen, these signals behave like a sine and a cosine signal.

FIG. 8 shows how the signals of FIG. 7 can be used to calculate the angle α, using for example an arctan or an arctan 2 function, or a look-up table, or in any other suitable manner.

FIG. 9 shows how the signal strength of the signals Bx, By of FIG. 7 varies as a function of the distance "ds" between the metal plate 110 and the sensor device 130. It came as a surprise that the signals reach a maximum amplitude of about 8 mT at a distance of about 2 mm "behind the metal plate". Such a signal is more than adequate to calculate the angular position of the knob.

This plot also shows that the rotary button system as presented herein is relatively insensitive to offset in the axial direction, since the signal only degrades marginally if the distance ds varies in the range from about 1.0 to 4.5 mm, especially when at last two components are measured, in which case the absolute value is not important, but the ratio of the two magnetic field components.

Tests have shown that the magnitude of the measured magnetic field component(s) is also quite insensitive to offset from said rotation axis (in a radial direction), but the angle calculation based on two magnetic field components may result in a noticeable angular error at sensor level. However, even a relatively large angular error (for example +/−10°) may be completely acceptable for a domestic appliance configured to detect the actual button position in for example only three or only four predefined positions (e.g. corresponding to three or four modes of operation of the device).

In some embodiments, the magnetic sensor device 130 is further adapted for determining a presence of the button at said predefined distance from the ferromagnetic plate, or stated in other words, to detect whether the knob is mounted to the metal plate or not. This can be implemented for example by measuring at least two magnetic field components (preferably orthogonal components), and by determining whether at least one of these measured field components has a value larger than a predefined threshold. In the example of FIG. 9, the threshold value may for example be chosen as a value in the range from 1 to 3 mT. And if this condition is satisfied, it is decided that the button is present. And if the condition is not satisfied, it is decided that the button is not present.

In a variant of this method, where at least two magnetic sensors are arranged in quadrature, a sum of the squares of the measured field component values may be compared to a predefined threshold.

Figure 10:
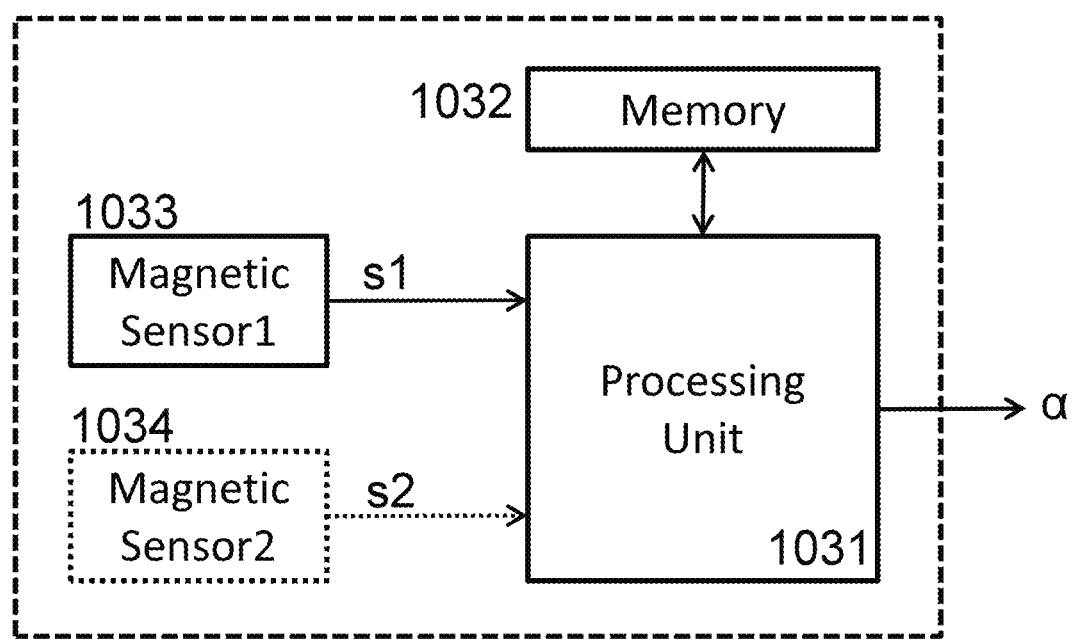
FIG. 10 shows an exemplary block diagram of a magnetic sensor device, as may be used in the rotary button system of FIG. 1 or FIG. 2.

FIG. 10 shows an electrical block-diagram of a circuit that can be used in the angular position sensor device 130, for example further comprising one or two vertical Hall elements VH1, VH2 as shown in FIG. 5.

The processing unit 1031 may be adapted for determining the angular position in any known manner, for example in case both sensors are present, using the formula: α=arctan 2(s2, s1), where s1 is the value provided by the first magnetic sensor 1033 (or a value derived therefrom, e.g. after amplification), and s2 is the value provided by the second magnetic sensor 1034 (or a value derived therefrom).

The processing unit 1031 may comprise a digital processor comprising or connected to a non-volatile memory 1032 storing executable instructions and/or a look-up table or other values. The processing unit 1031 may provide the result as an analog signal, or as a digital signal, for example via a data interface, for example a serial bus interface (e.g. using the I2C protocol, or using RS232 protocol, or any other suitable protocol). Angular position sensor devices are known in the art, and therefore need not be described in more detail here. They are not the main focus of the present invention.

Figure 11:
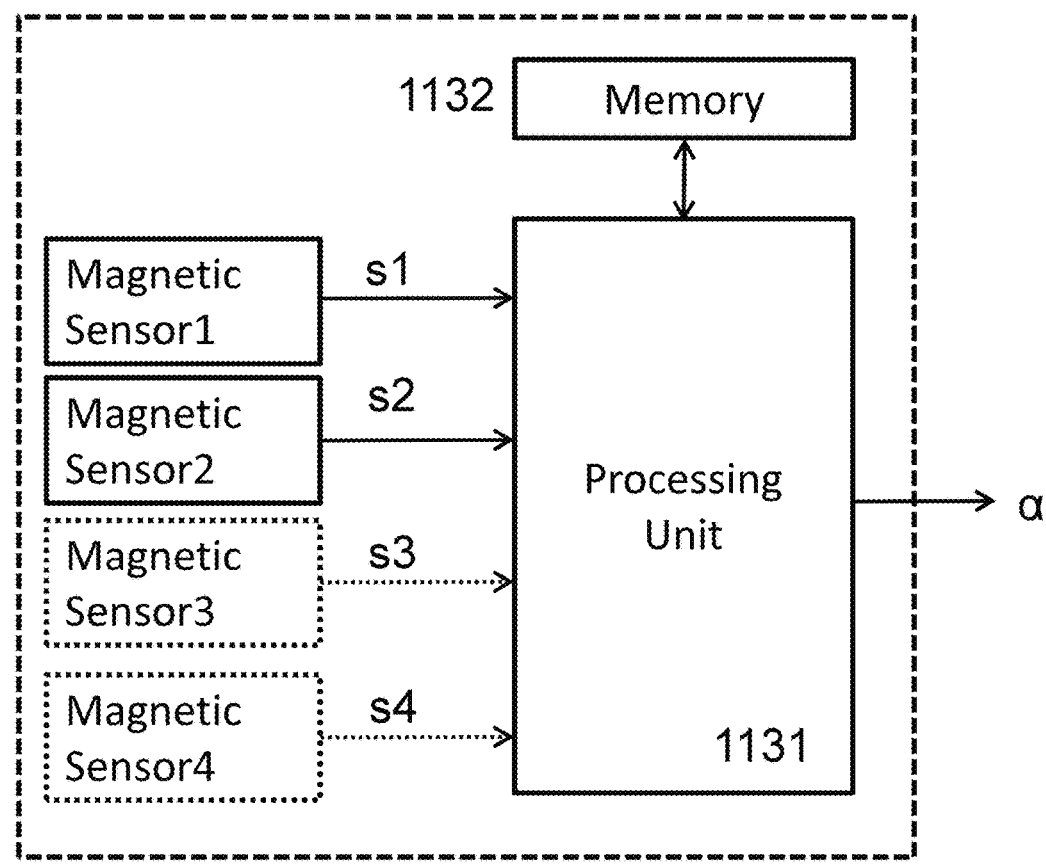
FIG. 11 shows another exemplary block diagram of a magnetic sensor device, as may be used in the rotary button system of FIG. 1 or FIG. 2.

FIG. 11 shows an electrical block-diagram of a circuit that can be used in the angular position sensor device 130, for example further comprising two or four of the horizontal Hall elements HH1 to HH4 shown in FIG. 4. The processing unit 1131 may be adapted for determining the angular position in any known manner, for example using the set of formulas: diff1=HH2−HH1, diff2=HH4−HH3, α=arctan 2(diff2, diff1). This circuit can be seen as a variant of the circuit FIG. 10, and may likewise contain a digital processor and/or a non-volatile memory, and/or an analog or a digital serial interface.

FIG. 12 to FIG. 14 show a few exemplary buttons and magnets comprised therein, as can be used in a rotary button system 100 of FIG. 1 and the rotary button system 300 of FIG. 3.

FIG. 12 shows a button 1220 comprising a single axially magnetized bar magnet 1222 where the axial direction of the magnet is oriented substantially perpendicular to the rotation axis of the knob 1220 (thus during use, substantially parallel to the metal plate 110).

FIG. 13 shows another variant of the button shown in FIG. 1, comprising a diametrically magnetized ring magnet, having a central axis coinciding with the rotation axis of the knob.

FIG. 14 shows a button 1420 which can be considered to be yet another variant of the button 120 shown in FIG. 1. The button 1420 comprises a single axially magnetized cylindrical magnet 1422 where the axial direction of the magnet is oriented substantially perpendicular to the rotation axis of the knob 1420 (thus during use, substantially parallel to the metal plate 110).

The behaviour of a rotary knob system comprising the knob 1220 of FIG. 12 or the knob 1420 of FIG. 14 is expected to be very similar as far as the angular position is concerned, but the attractive force between the metal plate and the cylindrical magnet 1422 is expected to be lower than for the bar magnet 1222 (for a same distance between the magnet and the metal plate), because of the rounding.

From these examples, it shall be clear that rotary buttons having an axially magnetized magnet with a cross section other than square or rectangular or circular can also be used.

Figure 15:
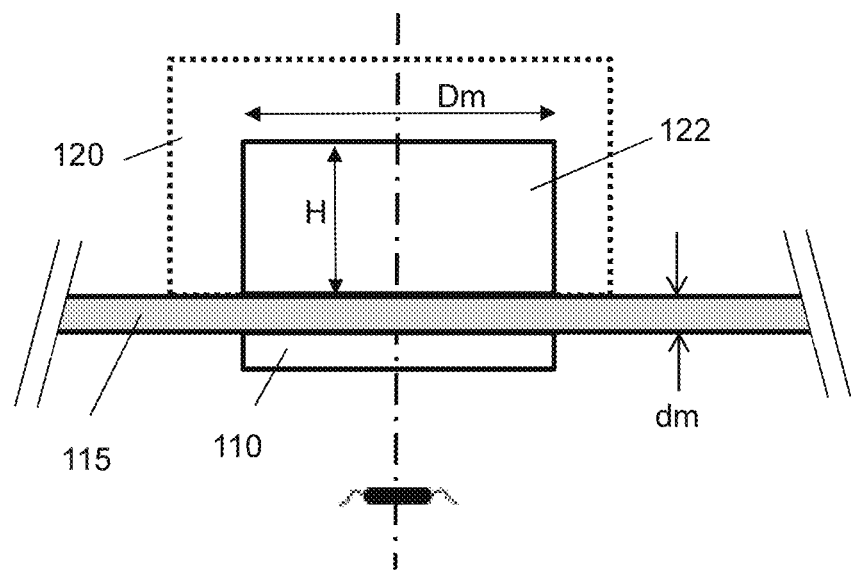
FIG. 15 shows a first example of how the distance between the metal plate and the magnet can be realised, in the example by placing a glass or plastic plate between the metal plate and the knob.
Figure 16:
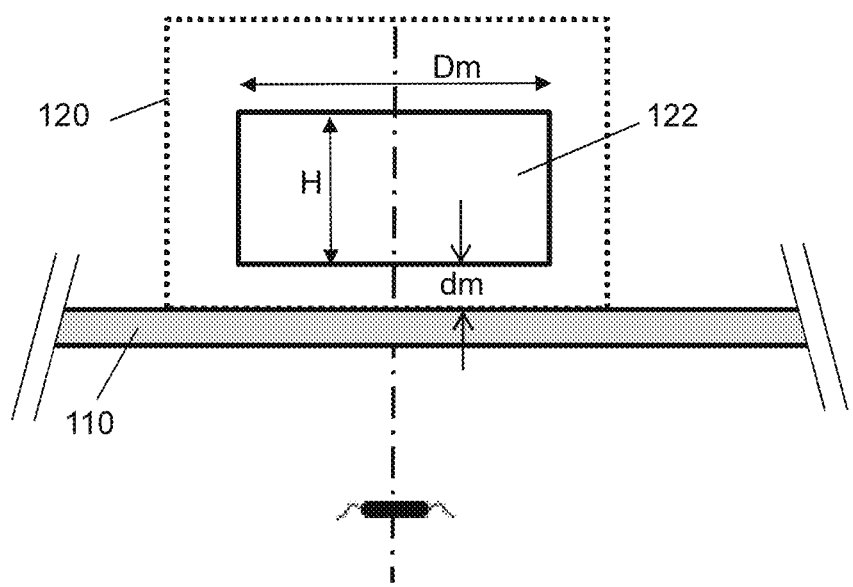
FIG. 16 shows another example of how the distance between the metal plate and the magnet can be realised, in the example by locating the magnet at an offset from a button surface of the button.

FIG. 15 and FIG. 16 show two examples of how the distance between the metal plate and the magnet can be realised, but the present invention is not limited to these examples.

FIG. 15 shows a first example of how the distance "dm" between the metal plate and the magnet can be realised, in the example by placing a glass or plastic plate 115 between the metal plate 110 and the knob 120.

FIG. 16 shows another example of how the distance "dm" between the metal plate 110 and the magnet 122 can be realised, in the example by locating the magnet 122 at an offset from a button surface of the button 120, for example by gluing or overmolding.

A combination of the principles of FIG. 15 (using a glass or plastic plate) and FIG. 16 (locating the magnet at an offset position) is also possible.

Other ways of providing the distance between the metal plate and the magnet are also contemplated, for example by a plastic plate with grooves and/or protrusions (not shown).

FIG. 17 shows another variant of the button 1720 shown in FIG. 1 or FIG. 2, comprising a multipole disk magnet 1722 magnetized in a direction substantially perpendicular to the rotation axis 1705 of the knob 1720. Such a magnet is known per se in the art, and sensor devices (not shown in FIG. 17, but see FIG. 1) for determining an angular position using such a magnet are also known in the art, but not in combination with a metal plate as described in this document. Suitable sensor devices are for example described in WO2014029885A1, which document is incorporated by reference herein in its entirety, especially the sections describing sensor arrangements for measuring the magnetic field at several locations and in particular directions, and the sections with formulas for calculating the angular position of a multipole magnet, more specifically for a quadrupole. In short, suitable sensor devices typically comprise a plurality of sensor elements which are spaced apart, and which are oriented in predefined directions. The angular position can be calculated for example based on a arctan function of a ratio of difference signals. It is pointed out however, that the present invention is not limited only to the sensor devices described in WO2014029885A1, and other suitable sensor devices may also be used. The multipole magnet 1722 is a four-pole magnet, also known as quadrupole, but the invention also works for magnets having more than four poles, for example having six or eight poles.

FIG. 18 shows a variant of FIG. 17, wherein the knob 1820 comprises a four-pole ring magnet.

In yet another variant (not shown) of FIG. 17 and FIG. 18, the knob comprises a magnetic structure as described in EP3321638(A1), having magnetic field components with different periodicities, for example the combination of a quadrupole and a dipole. This allows for very accurate positioning in combination with a 360° angular range. The document EP3321638A1 is also incorporated herein by reference in its entirety. A rotary button system comprising such a knob would comprise a suitable sensor device, for example as described in EP3321638A1, capable of measuring magnetic field components and of calculating field gradients, and configured for determining the angular position based thereon.

While individual features are explained in different drawings and different embodiments of the present invention, it is contemplated that features of different embodiments can be combined, as would be obvious to the skilled person, when reading this document.

The invention claimed is:

1. A rotary button system for use in a domestic apparatus, comprising:
   a ferromagnetic plate;
   a rotary button removably mountable at a predefined first distance from said ferromagnetic plate on a first side of said plate, and rotatable about a virtual rotation axis substantially perpendicular to said plate, wherein the rotary button comprises a permanent magnet therein, said permanent magnet magnetised in a direction substantially perpendicular to said rotation axis; and a magnetic sensor device mounted at a predefined second distance from said ferromagnetic plate on a second side of said plate opposite the first side;

wherein the magnetic sensor device comprises at least one magnetic sensor for measuring at least one magnetic field component of a magnetic field generated by said permanent magnet inside the rotary button, and is configured for determining an angular position of the rotary button based on said at least one magnetic field component, and/or wherein the magnetic sensor device comprises at least two magnetic sensors, and is configured for determining at least one magnetic field gradient of the magnetic field generated by said permanent magnet inside the rotary button, and is configured for determining an angular position of the rotary button based on said at least one magnetic field gradient.

2. The rotary button system according to claim 1, wherein the magnetic sensor device comprises at least two magnetic sensors for measuring at least two magnetic field components in different directions, and is configured for determining an angular position of the rotary button based on said at least two magnetic field components.

3. The rotary button system according to claim 1, wherein the magnetic sensor device comprises at least four magnetic sensors for measuring at least four magnetic field components, and is configured for determining at least two magnetic field gradients in different directions, and is configured for determining an angular position of the rotary button based on said at least two magnetic field gradients.

4. The rotary button system according to claim 1, wherein the ferromagnetic plate has a disk shape.

5. The rotary button system according to claim 1, wherein the ferromagnetic plate has a rectangular shape.

6. The rotary button system according to claim 1, wherein the ferromagnetic plate has a shape and size sufficiently large, such that the ferromagnetic plate prevents that the magnetic sensor device and the magnet are in direct line of sight for any angular position of the rotary button, when the rotary button is mounted to the ferromagnetic plate.

7. The rotary button system according to claim 1, wherein the ferromagnetic plate has a thickness in a range from 0.3 to 1.0 mm.

8. The rotary button system according to claim 1, wherein the magnetic sensor device is located substantially on said rotation axis.

9. The rotary button system according to claim 1, wherein the permanent magnet is one of the following:
a diametrically magnetized disk magnet arranged substantially coaxially with said rotation axis;
a diametrically magnetized ring magnet arranged substantially coaxially with said rotation axis;
an axially magnetised magnet arranged such that the axial direction of the magnet is substantially perpendicular to said rotation axis; or
a multipole disk magnet or a multipole ring magnet having at least four poles, magnetized in a plane substantially perpendicular to said rotation axis.

10. The rotary button system according to claim 1, wherein the magnet is a diametrically magnetised disk magnet having a diameter in a range from 4 to 14 mm;

or wherein the magnet is a multipole ring magnet or a multipole disk magnet having a diameter in a range from 4 to 14 mm;

or wherein the magnet is an axially magnetised magnet having an axial length in a range from 4 to 14 mm.

11. The rotary button system according to claim 1, wherein the second distance between the magnetic sensor device and the ferromagnetic plate is a value in a range from 0.5 to 6.5 mm.

12. The rotary button system according to claim 1,
wherein the magnet is a diametrically magnetised disk magnet having a diameter in a range from 4 to 14 mm, or an axially magnetised magnet having an axial length in a range from 4 to 14 mm; and
wherein the first distance between the ferromagnetic plate and the magnet is a value in a range from 0.5 to 1.5 mm; and
wherein the ferromagnetic plate has a thickness in a range from 0.3 to 1.0 mm; and
wherein the second distance between the ferromagnetic plate and the magnetic sensor device is a value in a range from 1.0 to 4.5 mm.

13. The rotary button system according to claim 1, wherein the magnetic sensor device comprises only a single magnetic sensor, and is configured for determining one out of three predefined angular positions.

14. The rotary button system according to claim 1, wherein the magnetic sensor device is a packaged semiconductor device comprising a single semiconductor substrate; and
said at least one magnetic sensor provided on the single semiconductor substrate, or
said at least two magnetic sensors provided on the single semiconductor substrate.

15. The rotary button system according to claim 1, wherein the rotary button system comprises only a single magnet, the single magnet being the permanent magnet inside the rotary button.

16. The rotary button system according to claim 1,
wherein the magnetic sensor device comprises a semiconductor substrate; and
wherein the magnetic sensor device has a plurality of magnetic sensors configured for measuring at least two magnetic field components oriented parallel to the semiconductor substrate in different directions, and for determining said angular position based on these at least two magnetic field components.

17. The rotary button system according to claim 16, wherein the plurality of magnetic sensors comprises at least a first vertical Hall element having a first axis of maximum sensitivity in a first direction parallel to the semiconductor substrate, and a second vertical Hall element having a second axis of maximum sensitivity in a second direction parallel to the semiconductor substrate, different from the first direction.

18. The rotary button system according to claim 16, wherein the plurality of magnetic sensors comprises at least four horizontal Hall elements and at least one integrated magnetic concentrator.

19. The rotary button system according to claim 1, wherein the magnetic sensor device is further adapted for determining a presence of the button at said predefined distance from the ferromagnetic plate.

20. The rotary button system according to claim 19, wherein the magnetic sensor device is adapted for determining the presence of the button by measuring at least two magnetic field components, and by determining whether at least one of these measured field components has a value larger than a predefined threshold.

\* \* \* \* \*